(12) United States Patent
Keller et al.

(10) Patent No.: US 10,147,853 B2
(45) Date of Patent: Dec. 4, 2018

(54) ENCAPSULANT WITH INDEX MATCHED THIXOTROPIC AGENT

(75) Inventors: Bernd Keller, Santa Barbara, CA (US); Theodore Lowes, Lompoc, CA (US)

(73) Assignee: CREE, INC., Durham, NC (US)

( * ) Notice: Subject to any disclaimer, the term of this patent is extended or adjusted under 35 U.S.C. 154(b) by 0 days.

(21) Appl. No.: 13/051,894

(22) Filed: Mar. 18, 2011

(65) Prior Publication Data

US 2012/0235190 A1 Sep. 20, 2012

(51) Int. Cl.
*H01L 33/52* (2010.01)
*H01L 33/56* (2010.01)

(52) U.S. Cl.
CPC ...... *H01L 33/56* (2013.01); *H01L 2924/0002* (2013.01)

(58) Field of Classification Search
CPC ..... H01L 33/56; H01L 33/54; H01L 23/3121; H01L 23/3135
USPC ..................... 257/98, 100; 313/512
See application file for complete search history.

(56) References Cited

U.S. PATENT DOCUMENTS

| | | | |
|---|---|---|---|
| 4,013,916 A | 3/1977 | Brown | |
| 4,143,394 A | 3/1979 | Schoberl | 257/680 |
| 4,946,547 A | 8/1990 | Palmour et al. | |
| 5,200,022 A | 4/1993 | Kong et al. | |
| RE34,861 E | 2/1995 | Davis et al. | |
| 6,350,041 B1 | 2/2002 | Tarsa et al. | |
| 6,521,915 B2 | 2/2003 | Odaki et al. | 257/98 |
| 6,686,676 B2 | 2/2004 | McNulty et al. | 313/112 |
| 6,867,542 B1 | 3/2005 | Sun | |
| 7,009,343 B2 | 3/2006 | Lim et al. | 315/150 |
| 7,213,940 B1 | 5/2007 | Van de Ven et al. | |
| 7,253,448 B2 | 8/2007 | Roberts et al. | |
| 7,279,346 B2 | 10/2007 | Andrews et al. | |

(Continued)

FOREIGN PATENT DOCUMENTS

| | | |
|---|---|---|
| CN | 1380703 | 11/2002 |
| CN | 1776506 | 5/2006 |

(Continued)

OTHER PUBLICATIONS

Defn. composite, Online Oxford dictionary, <http://oxforddictionaries.com/us/definition/american_english/composite?q=composite>.*

(Continued)

*Primary Examiner* — Eugene Lee
(74) *Attorney, Agent, or Firm* — Koppel, Patrick, Heybl & Philpott

(57) ABSTRACT

Emitter packages are disclosed having a thixotropic agent or material, with the encapsulant exhibiting significant reduction of thixotropic agent scattering. The packages exhibit a corresponding reduction or elimination of encapsulant clouding and increased package emission efficiency. This allows for the thixotropic agents to be included in the encapsulant to alter certain properties (e.g. mechanical or thermal) while not significantly altering the optical properties of the encapsulant. One embodiment of a light emitting diode (LED) package according to the present invention comprises an LED chip with an encapsulant over the LED chip. The encapsulant has an encapsulant refractive index and also has a thixotropic material with a refractive index that is substantially the same as the encapsulant refractive index.

21 Claims, 3 Drawing Sheets

(56) References Cited

U.S. PATENT DOCUMENTS

| | | |
|---|---|---|
| 7,326,583 B2 | 2/2008 | Andrews et al. |
| 7,365,371 B2 | 4/2008 | Andrews |
| 7,517,728 B2 | 4/2009 | Leung et al. |
| 7,521,728 B2 | 4/2009 | Andrews |
| 7,614,759 B2 | 11/2009 | Negley |
| 7,623,252 B2 | 11/2009 | Andrews et al. |
| 7,762,692 B2 | 7/2010 | Lai et al. |
| 7,821,023 B2 | 10/2010 | Yuan et al. |
| 7,834,375 B2 | 11/2010 | Andrews |
| D646,235 S | 10/2011 | Kuwaharada |
| D650,342 S | 12/2011 | Kuwaharada ............... D13/180 |
| 8,450,147 B2 | 5/2013 | Chandra .................. 438/106 |
| 2002/0163302 A1 | 11/2002 | Nitta et al. |
| 2003/0008431 A1 | 1/2003 | Matsubara et al. |
| 2004/0130880 A1 | 7/2004 | Min et al. |
| 2004/0217364 A1 | 11/2004 | Tarsa |
| 2004/0218390 A1 | 11/2004 | Holman ................... 362/245 |
| 2004/0227149 A1 | 11/2004 | Ibbetson et al. ........... 257/100 |
| 2005/0073840 A1 | 4/2005 | Chou et al. |
| 2005/0093005 A1 | 5/2005 | Ruhnau et al. ............. 257/79 |
| 2005/0173708 A1 | 8/2005 | Suehiro et al. |
| 2006/0049421 A1 | 3/2006 | Suehiro et al. |
| 2006/0060882 A1 | 3/2006 | Ohe et al. |
| 2006/0097245 A1 | 5/2006 | Aanegola .................. 257/26 |
| 2006/0097385 A1* | 5/2006 | Negley ............... H01L 33/486 257/722 |
| 2006/0124946 A1 | 6/2006 | Fujita |
| 2006/0138437 A1 | 6/2006 | Huang |
| 2006/0186431 A1 | 8/2006 | Miki ........................ 257/100 |
| 2006/0273337 A1 | 12/2006 | Han et al. |
| 2006/0278886 A1 | 12/2006 | Tomoda et al. |
| 2007/0029569 A1* | 2/2007 | Andrews ................. 257/99 |
| 2007/0096131 A1 | 5/2007 | Chandra .................. 257/99 |
| 2007/0102721 A1 | 5/2007 | DenBaars |
| 2007/0108463 A1 | 5/2007 | Chua et al. |
| 2007/0145397 A1 | 6/2007 | DenBaars |
| 2007/0152231 A1 | 7/2007 | Destain |
| 2007/0158668 A1 | 7/2007 | Tarsa et al. |
| 2007/0201225 A1 | 8/2007 | Holder et al. ............ 362/227 |
| 2007/0228387 A1 | 10/2007 | Negley et al. |
| 2007/0262339 A1* | 11/2007 | Hussell et al. ............ 257/99 |
| 2007/0284589 A1 | 12/2007 | Ng ............................ 257/79 |
| 2008/0006839 A1 | 1/2008 | Lin ............................ 257/98 |
| 2008/0012036 A1* | 1/2008 | Loh ..................... H01L 33/483 257/99 |
| 2008/0023711 A1 | 1/2008 | Tarsa et al. |
| 2008/0173884 A1 | 7/2008 | Chitnis et al. |
| 2008/0179611 A1 | 7/2008 | Chitnis |
| 2009/0050907 A1 | 2/2009 | Yuan |
| 2009/0050908 A1 | 2/2009 | Yuan et al. |
| 2009/0057699 A1 | 3/2009 | Basin |
| 2009/0091045 A1* | 4/2009 | Tanikawa et al. ........... 257/791 |
| 2009/0262515 A1 | 10/2009 | Lee et al. .................. 362/84 |
| 2009/0272995 A1 | 11/2009 | Ito et al. |
| 2009/0278147 A1 | 11/2009 | Suzuki |
| 2010/0103660 A1 | 4/2010 | van de Ven et al. |
| 2010/0140633 A1 | 6/2010 | Emerson |
| 2010/0140634 A1 | 6/2010 | Van de Ven ............... 257/88 |
| 2010/0155763 A1 | 6/2010 | Donofrio et al. |
| 2010/0252851 A1 | 10/2010 | Emerson |
| 2010/0276712 A1 | 11/2010 | Shaikevitch ............. 257/98 |
| 2010/0291374 A1 | 11/2010 | Akarsu .................... 428/328 |
| 2011/0001151 A1 | 1/2011 | Le Toquin ................ 257/98 |
| 2011/0001161 A1* | 1/2011 | Park .................. H01L 33/0079 257/98 |
| 2011/0031527 A1 | 2/2011 | Kotani et al. |
| 2011/0121331 A1* | 5/2011 | Simonian et al. ........... 257/98 |
| 2011/0140289 A1* | 6/2011 | Shiobara et al. ........... 257/789 |
| 2011/0156061 A1 | 6/2011 | Wang et al. |
| 2011/0215345 A1 | 9/2011 | Tarsa et al. ............... 257/88 |
| 2011/0220920 A1 | 9/2011 | Collins et al. |
| 2011/0221330 A1 | 9/2011 | Negley et al. |
| 2011/0228514 A1 | 9/2011 | Tong et al. ............... 362/84 |
| 2011/0279054 A1 | 11/2011 | Katona ..................... 315/291 |
| 2011/0291131 A1 | 12/2011 | Ito |
| 2011/0316006 A1 | 12/2011 | Xu |
| 2012/0043563 A1 | 2/2012 | Ibbetson ................. 257/88 |
| 2012/0061703 A1 | 3/2012 | Kobayashi |
| 2012/0062821 A1 | 3/2012 | Takeuchi et al. |
| 2012/0068198 A1 | 3/2012 | Andrews et al. ............. 257/88 |
| 2012/0068209 A1 | 3/2012 | Andrews |
| 2012/0087124 A1 | 4/2012 | Ravillisetty .................. 362/235 |
| 2012/0112220 A1 | 5/2012 | West |
| 2012/0119234 A1 | 5/2012 | Shioi |
| 2012/0193651 A1 | 8/2012 | Edmond et al. ............. 257/88 |
| 2012/0193662 A1 | 8/2012 | Donofrio .................. 257/98 |
| 2012/0193665 A1 | 8/2012 | Yamada |
| 2012/0248483 A1 | 10/2012 | Beppu ...................... 257/98 |
| 2013/0020600 A1 | 1/2013 | Yoo .......................... 257/98 |
| 2013/0033186 A1 | 2/2013 | Miyashita |
| 2013/0049025 A1 | 2/2013 | Chang |
| 2013/0105835 A1 | 5/2013 | Wu |
| 2013/0140580 A1 | 6/2013 | Wirth ....................... 257/76 |
| 2013/0300285 A1 | 11/2013 | Ito |
| 2013/0320369 A1 | 12/2013 | Gartner |
| 2013/0334559 A1 | 12/2013 | Vdovin et al. ............. 257/98 |
| 2014/0027795 A1 | 1/2014 | Reiherzer ................ 257/88 |
| 2015/0221837 A1 | 8/2015 | Yonezaki |

FOREIGN PATENT DOCUMENTS

| | | |
|---|---|---|
| CN | 1802756 | 7/2006 |
| CN | 1822365 | 8/2006 |
| CN | 1981388 A | 6/2007 |
| CN | 101467020 | 6/2009 |
| EP | 0441622 A1 | 2/1991 |
| EP | 1529807 A2 | 5/2005 |
| EP | 2042528 A1 | 9/2007 |
| EP | 2113949 A2 | 11/2009 |
| EP | 2196501 A1 | 12/2009 |
| EP | 2149920 A1 | 2/2010 |
| EP | 2336230 A1 | 6/2011 |
| JP | 2001301230 | 10/2001 |
| JP | 2006165029 | 6/2006 |
| JP | WO 2012099145 A1 | 6/2014 |
| KR | 100809658 | 3/2008 |
| WO | WO 2006059828 | 6/2006 |
| WO | WO 2006060141 A2 | 6/2006 |
| WO | WO 061650 A1 | 5/2011 |
| WO | WO 2011129383 A1 | 10/2011 |
| WO | WO 2012016850 A1 | 2/2012 |
| WO | WO 2012084451 A1 | 6/2012 |
| WO | WO 2012/091971 A1 | 7/2012 |
| WO | WO 2012120434 | 9/2012 |

OTHER PUBLICATIONS

U.S. Appl. No. 11/656,759, filed Jan. 22, 2007, Chitnis, et al.
U.S. Appl. No. 11/899,790, filed Sep. 7, 2007, Chitnis, et al.
U.S. Appl. No. 11/473,089, filed Jun. 21, 2006, Tarsa, et al.
U.S. Appl. No. 12/463,709, filed May 11, 2009, Donofrio.
U.S. Appl. No. 13/034,501, filed Feb. 24, 2011, Le, et al.
U.S. Appl. No. 13/028,946, filed Feb. 16, 2011, Le, et al.
U.S. Appl. No. 13/368,217, filed Feb. 7, 2012, Pickard, et al.
U.S. Appl. No. 12/873,303, filed Aug. 31, 2010, Edmond, et al.
Cree® family of LED chips, DA, EZ, GaN, MB, RT, TR, UT, and XT, printout from cree.com, 2 pages.
Bergquist Co., Chanhassen, Minn., "T-Clad" overview product sheet, 3 pages.
Cree® XLampC family product info printout, from cree.com, 20 pages.
Citizen Micro HumanTech. "COB-High-wattage Series & Low-wattage Series", Short Form Lighting LED Catalog 2012, Citizen Electronics Co., Ltd. Japan, 7 pages.
Cabot Corporation "Cab-o-Sil®" Untreated Fumed Silica, MDS, 6 pages.
International Search Report for PCT Patent Application No. PCT/US2012/028327, dated Nov. 23, 2012.
International Search Report from PCT/US2013/044277, dated Jan. 7, 2014.

(56) References Cited

OTHER PUBLICATIONS

First Office Action from Chinese Patent Appl. No. 201210031021.0, dated Dec. 30, 2013.
International Preliminary Report on Patentability from PCT/US2012/026327, dated Oct. 3, 2013.
Office Action from U.S. Appl. No. 13/040,088, dated May 7, 2013.
Response to OA from U.S. Appl. No. 13/040,088, filed Jun. 20, 2013.
Office Action from U.S. Appl. No. 13/649,067, dated Jul. 7, 2014.
Office Action from U.S. Appl. No. 13/649,052, dated Jul. 24, 2014.
Second Office Action from Chinese Patent Appl. No. 201210031021.0, dated Jun. 4, 2014.
International Search Report and Written Opinion from PCT/US2013/062640, dated May 22, 2014.
International Search Report and Written Opinion from Appl. No. PCT/US2014/045888, dated Sep. 19, 2014.
Fourth Office Action from Chinese Patent Appl. No. 201210031021.0, dated Jul. 16, 2015.
Decision to Grant from German Patent Appl. No. 10 2007 040 811.2, dated Jul. 3, 2015.
Office Action from U.S. Appl. No. 13/902,080, dated Jun. 2, 2015.
Office Action from U.S. Appl. No. 13/770,389, dated Jul. 1, 2015.
Office Action from U.S. Appl. No. 13/957,290, dated Jul. 6, 2015.
Office Action from Patent Application No. 13/770,389, dated Sep. 15, 2014.
Notification of the Third Office Action from Chinese Patent Appl. No. 201210031021.0, dated Jan. 28, 2015.
Correction of Deficiencies notice from European Patent Appl. No. 13730742.7-1551, dated Feb. 3, 2015.
Office Action from German Patent Appl. No. 10 2007 040 811.2, dated Feb. 12, 2015.
Notice of Acceptance for Invalidation from Chinese Appl. No. 200710148327.3, dated Jan. 27, 2015 and Chinese version.
International Preliminary Report and Written Opinion from Appl. No. PCT/US2013/044277, dated Dec. 24, 2014.
International Preliminary Report on Patentability from Appl. No. PCT/US2013/062640, dated Apr. 23, 2015.
Office Action from U.S. Appl. No. 13/649,067, dated Feb. 18, 2015.
Office Action from U.S. Appl. No. 13/770,389, dated Mar. 12, 2015.
Office Action from U.S. Appl. No. 14/183,218, dated Aug. 10, 2015.
Office Action from U.S. Appl. No. 13/902,080, dated Sep. 24, 2015.
Office Action from U.S. Appl. No. 13/649,067, dated Oct. 1, 2015.
Office Action from U.S. Appl. No. 13/770,389, dated Oct. 26, 2015.
Office Action from U.S. Appl. No. 13/770,389, dated Mar. 23, 2016.
Office Action from U.S. Appl. No. 14/183,218, dated Mar. 24, 2016.
Office Action from U.S. Appl. No. 13/649,067; dated Apr. 14, 2016.
Notification of Entry into European Phase for Appl. No. 14742722.3; Mar. 18, 2016.
Notice of Allowance letter from Chinese Patent Appl. No. ZL201210031221.0, dated Jan. 5, 2016.
Office Action from U.S. Appl. No. 13/957,290; dated Jan. 21, 2016.
Foreign Office Action for European Patent Appl. No. 13730742.7; dated Oct. 14, 2016.
Office Action for U.S. Appl. No. 14/633,734; dated Nov. 3, 2016.
Foreign Office Action for European Application No. 14742722.3; dated Nov. 3, 2016.
Foreign Office Action for Taiwan Application No. 04489/10521496400; dated Dec. 5, 2016.
Office Action for U.S. Appl. No. 13/649,067; dated Dec. 15, 2016.
Office Action from Chinese Application No. 2013800306646; dated Jun. 15, 2016.
Office Action for U.S. Appl. No. 14/575,805; dated Jul. 21, 2016.
Office Action for U.S. Appl. No. 13/902,080; dated Aug. 12, 2016.
Office Action for U.S. Appl. No. 13/770,389; dated Aug. 17, 2016.
Office Action for U.S. Appl. No. 14/183,218; dated Sep. 6, 2016.
Office Action for U.S. Appl. No. 13/957,290; dated Sep. 12, 2016.
Office Action for U.S. Appl. No. 13/770,389; dated Mar. 9, 2017.
Office Action for U.S. Appl. No. 14/183,218; dated Apr. 5, 2017.
Foreign Notice of Allowance for Taiwan Application No. 102120670; dated May 1, 2017.
Search Report for Chinese Application No. 201480043303X; dated Nov. 7, 2017.
First Office Action for Chinese Application No. 201480043303X; dated Nov. 15, 2017.
Office Action for U.S. Appl. No. 14/575,805; dated Feb. 5, 2018.
Office Action for U.S. Appl. No. 14/633,734; dated Sep. 20, 2017.
Office Action for U.S. Appl. No. 13/770,389; dated Sep. 22, 2017.
Office Action for U.S. Appl. No. 13/902,080; dated Oct. 31, 2017.
Office Action for U.S. Appl. No. 13/770,389; dated Feb. 22, 2018.
Office Action for U.S. Appl. No. 14/183,218; dated Apr. 25, 2018.
Chinese Office Action for Application No. 201380030664.6; dated Jul. 17, 2017.
Chinese Office Action for Application No. 201380030664.6; dated Jul. 26, 2017.
Office Action for U.S. Appl. No. 14/575,805; dated Aug. 28, 2017.
Office Action for U.S. Appl. No. 14/183,218; dated Sep. 11, 2017.
Office Action for U.S. Appl. No. 13/902,080; dated May 25, 2018.
Office Action for U.S. Appl. No. 14/633,734; dated Jun. 29, 2018.
Office Action for U.S. Appl. No. 14/575,804; dated Aug. 6, 2038.

\* cited by examiner

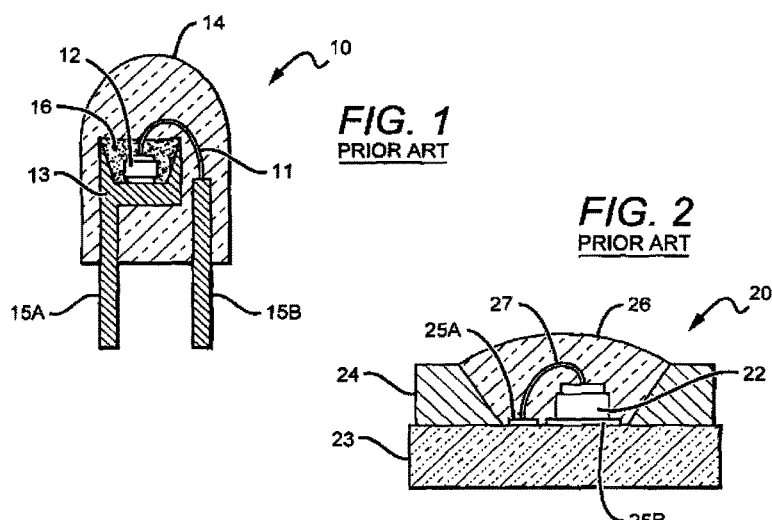
*FIG. 1*
PRIOR ART
*FIG. 2*
PRIOR ART
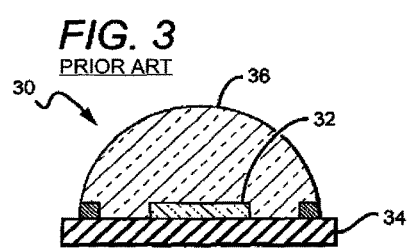
*FIG. 3*
PRIOR ART
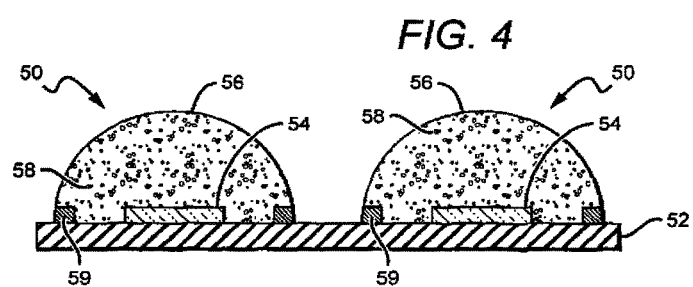
*FIG. 4*

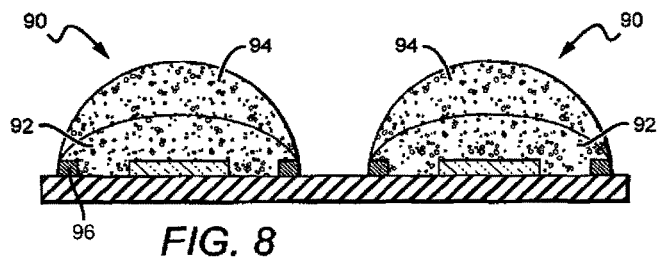
FIG. 8
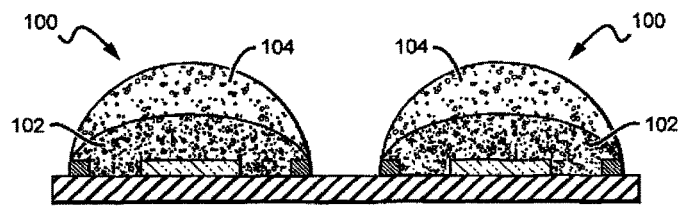
FIG. 9
FIG. 10
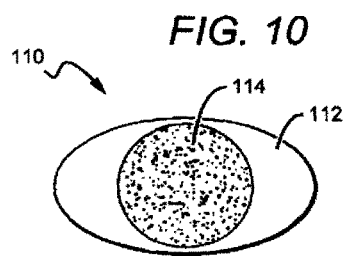
FIG. 11
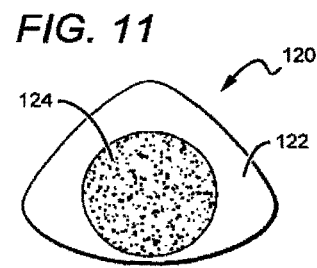

US 10,147,853 B2

ENCAPSULANT WITH INDEX MATCHED THIXOTROPIC AGENT

BACKGROUND OF THE INVENTION

Field of the Invention

This invention relates to solid state lighting packages, and more particularly to LED packages having encapsulants with thixotropic agents.

Description of the Related Art

Incandescent or filament-based lamps or bulbs are commonly used as light sources for both residential and commercial facilities. However, such lamps are highly inefficient light sources, with as much as 95% of the input energy lost, primarily in the form of heat or infrared energy. One common alternative to incandescent lamps, so-called compact fluorescent lamps (CFLs), are more effective at converting electricity into light but require the use of toxic materials which, along with its various compounds, can cause both chronic and acute poisoning and can lead to environmental pollution. One solution for improving the efficiency of lamps or bulbs is to use solid state devices such as light emitting diodes (LED or LEDs), rather than metal filaments, to produce light.

Light emitting diodes generally comprise one or more active layers of semiconductor material sandwiched between oppositely doped layers. When a bias is applied across the doped layers, holes and electrons are injected into the active layer where they recombine to generate light. Light is emitted from the active layer and from various surfaces of the LED.

In order to use an LED chip in a circuit or other like arrangement, it is known to enclose an LED chip in a package to provide environmental and/or mechanical protection, color selection, light focusing and the like. An LED package also includes electrical leads, contacts or traces for electrically connecting the LED package to an external circuit. In a typical LED package 10 illustrated in FIG. 1, a single LED chip 12 is mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup may be filled with an encapsulant material 16 which may contain a wavelength conversion material such as a phosphor. Light emitted by the LED at a first wavelength may be absorbed by the phosphor, which may responsively emit light at a second wavelength. The entire assembly can then be encapsulated in a clear protective resin 14, which may be molded in the shape of a lens to collimate the light emitted from the LED chip 12.

FIG. 2 shows another embodiment of a conventional LED package 20 comprising one or more LED chips 22 mounted to a carrier such as a printed circuit board (PCB) carrier, substrate or submount 23. A metal reflective cup 24 mounted on the submount 23 surrounds the LED chip(s) 22 and reflects light emitted by the LED chips 22 away from the package 20. The reflective cup 24 also provides mechanical protection to the LED chips 22. One or more wire bond connections 27 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflective cup 24 is typically attached to the carrier by means of a solder or epoxy bond.

FIG. 3 shows another embodiment conventional LED package 30 having an LED chip 32 mounted on a submount 34, similar to the LED package 20 shown in FIG. 2. In this embodiment, however, there is no reflective cup. In this embodiment, an encapsulant 36 is formed directly over the LED chip 32 and on the surface of the submount around the LED chip 32. Like the encapsulant in package 20, the encapsulant 36 can provide environmental and/or mechanical protection and can shape or alter the light emitting from the package.

Many encapsulants used in conventional LED packages utilize a thixotropic or thickening agent/material that can help the encapsulant maintain the desired shape. The packages shown in FIGS. 2 and 3, the encapsulant is in a hemispheric shape, and for dispensed lenses the thixotropic agent helps the encapsulant maintain a hemispheric shape particularly in the time between when the encapsulant is dispensed or molded, and when it is cured. One of the most common thixotropic agents is fumed silica that is commercially available from sources such as Cabot Corporation and Evonik Industries. Fumed silica is a relatively common material that is used in many different applications and has a very strong thickening effect. Fumed silica can be provided in particles that typically have a size in the range of 5-50 nanometers (nm). The particles can be non-porous and can have a surface area of 50-600 $m^2/g$, with a density of around 2.2 $g/cm^3$.

Many thixotropic agents can have an index of refraction that is different from the LED package encapsulant. For example, fumed silica can have an index of refraction of approximately 1.46, and can be mixed in a conventional encapsulant such as silicone which has an index or refraction of 1.51 or more. This difference in index of refraction between the thixotropic agent and the encapsulant can result in the encapsulant exhibiting scattering characteristics for the light passing through the encapsulant from the LED. This scattering not only gives the encapsulant a cloudy (i.e. not clear) appearance, but can reduce emission package efficiency by reducing the total light output from the package.

SUMMARY OF THE INVENTION

The present invention is generally directed to emitter packages having a thickening or thixotropic agent/material, with properties that allow the LED package encapsulant to exhibit a significant reduction in scattering. The packages according to the present invention exhibit a corresponding reduction or elimination of encapsulant clouding and increased package emission efficiency. This allows for the thickening or thixotropic agents to alter certain properties (e.g. mechanical or thermal) while not significantly altering the optical properties of the encapsulant.

One embodiment of a light emitting diode (LED) package according to the present invention comprises a LED chip and an encapsulant over the LED chip, with the encapsulant having an encapsulant refractive index. A thickening (or thixotropic) material is disposed in the encapsulant with the material comprising a composite of two or more materials, at least one of which has an index of refraction lower than the encapsulant refractive index, and at least one of which has a material with a refractive index higher than the encapsulant refractive index.

Another embodiment of an LED package according to the present invention comprises an LED chip emitting light in response to an electrical signal. An encapsulant is included over the LED chip with at least some of the LED light passing through the encapsulant. The encapsulant has a thickening agent dispersed therein with the encapsulant and thickening agent combination being substantially optically clear to the LED light.

Another embodiment of an LED package according to the present invention comprises an LED chip and an encapsulant over the LED chip. The encapsulant has an encapsulant refractive index and has a thixotropic material with a refractive index that is within plus or minus n=0.05 of the encapsulant refractive index.

One embodiment of a light emitting diode (LED) package according to the present invention comprises a LED chip with an encapsulant over the LED chip. The encapsulant has an encapsulant refractive index and also has a thixotropic material with a refractive index that is approximately the same as the encapsulant refractive index.

These and other aspects and advantages of the invention will become apparent from the following detailed description and the accompanying drawings which illustrate by way of example the features of the invention.

BRIEF DESCRIPTION OF THE DRAWINGS

FIG. 1 is a sectional view of one embodiment of a conventional LED package;

FIG. 2 is a sectional view of another embodiment of a conventional LED package;

FIG. 3 is a sectional view of still another embodiment of a conventional LED package;

FIG. 4 is a sectional view of two LED packages according to the present invention prior to singulating;

FIG. 8 is a sectional view of another embodiment of an LED package according to the present invention having encapsulant portions;

FIG. 9 is a sectional view of still another embodiment of an LED package according to the present invention having encapsulant portions;

FIG. 10 is a top view of one embodiment of an LED package encapsulant according to the present invention; and FIG. 11 is a top view of another embodiment of an LED package encapsulant according to the present invention.

DETAILED DESCRIPTION OF THE INVENTION

Figure 5:
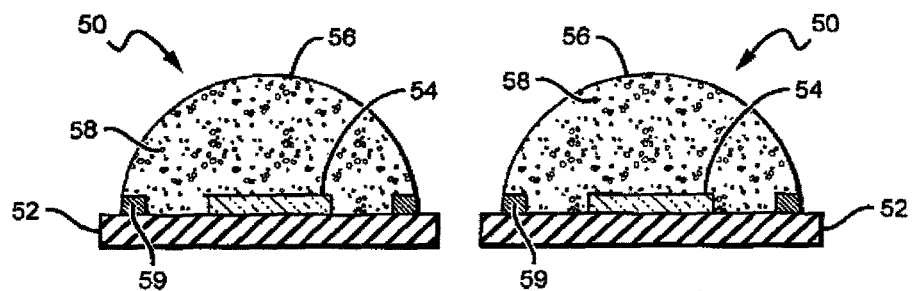
FIG. 5 is a sectional view of the LED packages in FIG. 4 following singulating.

The present invention is directed to different embodiments of semiconductor device packages, and in particular solid state lighting packages utilizing an encapsulant. Some embodiments of the present invention are directed to light emitting diode (LED) packages having an encapsulant for environmental and/or mechanical protection, color selection, light focusing and the like. The encapsulant can comprise a thickening or thixotropic agent/material that helps hold the encapsulant in the desired shape prior to and during curing.

As mentioned above, it can be desirable to include a thickening agent or material in the encapsulant to help it hold the desired shape (e.g. hemispheric) prior to and during curing. Thickening can also include increasing the viscosity of the encapsulant. In the case of encapsulants that are formed by processes such as stamping or molding, many different thickening materials can be used. For encapsulants that are formed by dispensing it can be desirable to have thickening agents that exhibit thixotropic properties. Thixotropic agents comprise a material, such as particles, that can be mixed in the encapsulant and thixotropic properties include a thickening effect when the encapsulant material is at rest. In some embodiments this thickening can form the encapsulant in a gel state. Thixotropic properties can also include the characteristics of encapsulant material becoming a liquid when agitated, stirred or shaken. It can be difficult dispensing encapsulant materials that are not in liquid form, and this property of becoming liquid when agitated can be desirable for dispensing encapsulants. The thixotropic properties allow for the encapsulant material to be in a liquid form, such as through agitation, prior to and as the encapsulant material is being dispensed over the LED(s). The thixotropic properties then allow the encapsulant to take its thickened state over the LED when the encapsulant comes to rest over the LED, and allows the encapsulant to hold the desired shape until cured.

The discussion below refers to thixotropic agents or materials, but it is understood that this also refers to thickening agents that do not exhibit thixotropic characteristics. These non-thixotropic thickening agents can be utilized in molding and stamping processes for forming the encapsulant. It is understood that the invention described herein encompasses thickening materials that can be thixotropic and non-thixotropic agents or materials.

The different embodiments of the present invention comprise thixotropic agents that comprise a material having an index of refraction that is the same as or close to that of the encapsulant material. By matching the index of refraction, the scattering effect of the thixotropic agent can be reduced or eliminated. Stated differently, the light from the package LED or LEDs can pass through the encapsulant without being scattered interfaces between the thixotropic materials and the encapsulant materials of different refractive indices. The light can pass through the encapsulant in approximately the same manner as light passing through an encapsulant without a thixotropic agent. By not scattering the light, the cloudy appearance of the encapsulant can be reduced or eliminated, and the decrease in LED package emission caused by the scattering can be reduced or eliminated.

The present invention is directed to packages having many different types of encapsulants that can comprise a single material or combinations of materials. Likewise, the thixotropic agents can comprise many different materials that when combined in the appropriate percentages result in the desired refractive index that matches or nearly matches that of the encapsulant. In some embodiments the encapsulant can comprise a polymer material, and the thixotropic agent can comprise one or more oxides or ceramics. In still other embodiments, the encapsulant can comprise other materials mentioned below, with the thixotropic agent comprising a combination of one or more oxides or ceramics.

Matching the refractive index of the encapsulant and thixotropic agent can allow for changing certain properties of the encapsulant without changing the optical characteristics of the encapsulant. In some embodiments, the thixotropic agent can alter the mechanical properties of the encapsulant, without altering the encapsulant's optical properties. These mechanical properties can include, but are not limited to, the thickening effect mentioned above that allows an encapsulant to hold its shape prior to curing, or the durometer of the cured lens (a measure of the hardness of the cured material).

This matching of refractive index can also allow for increased percentages of thixotropic agents to be included in the encapsulant. That is, because the thixotropic agents do not scatter light, or results in minimal scattering, increased percentages of thixotropic agents can be included in the encapsulant. This can allow for changing of the mechanical properties to a greater degree without unacceptable impact on the package's optical properties.

In other embodiments, other properties can be changed without changing optical properties. Thixotropic agents that have an increased thermally conductivity, yet are index matched, can be added to the encapsulant to enhance its thermal dissipation characteristics. By being index matched, increased percentages of the thixotropic agents can be added without a negative impact on appearance and emission efficiency, while at the same time increasing the ability of the encapsulant to dissipate heat from the LED or LEDs. In these embodiments, both the mechanical (i.e. thickening) and thermal properties of the encapsulant can be enhanced. In these embodiments, the encapsulant can also be provided with features to further enhance light extraction, such as roughness, protrusions or heat fins.

In those embodiments where it can be desirable to increase the electrical conductivity of the encapsulant, electrically conductive thixotropic agents can be included in the encapsulant. Like above, these agents can be index matched to encapsulant such that increased percentages of the agents can be included without negatively impacting the emission properties of the package. In these embodiments, both the mechanical and thermal properties of the encapsulant can be enhanced. In still other embodiments, the mechanical, thermal and electrical properties can all be enhanced by providing the appropriate thixotripic agent index matched to the encapsulant, and being electrically and thermally conductive.

The present invention is described herein with reference to certain embodiments, but it is understood that the invention can be embodied in many different forms and should not be construed as limited to the embodiments set forth herein. In particular, the present invention is described below in regards to certain LED packages having one or multiple LEDs or LED chips in different configurations, but it is understood that the present invention can be used for many other lamps having many different configurations. The embodiments below are described with reference to LED of LEDs, but it is understood that this is meant to encompass LED chips and LED packages. The components can have different shapes and sizes beyond those shown and different numbers of LEDs can be included. Similarly, in some embodiment, the LED or LEDs can be coated by phosphor layers or regions, while others may have either adjacent phosphor layers of different composition or no phosphor layer at all.

The present invention is described herein with reference to LED package encapsulants deposited on or over the LED(s), but it is understood that this can include lens or lens materials and can comprise lenses that are formed separately and then mounted over the LED. Further, this description is meant to include encapsulants that directly contact the LED, and those that do not. An opening can be included between the LED chip and the encapsulant, or an intervening layer or material can be between the two.

The present invention is described herein with reference to conversion materials, thixotropic or thickening agents, wavelength conversion materials, remote phosphors, phosphors, phosphor layers and related terms. The use of these terms should not be construed as limiting. It is understood that many different thixotropic or thickening agents can be used and the term remote phosphors, phosphor or phosphor layers is meant to encompass and be equally applicable to all wavelength conversion materials.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIGS. 4 and 5 show one embodiment of LED packages 50 according to the present invention. In FIG. 4, the LED packages 50 are shown prior to separation of the submount 52 into individual packages. Although only two LED packages 50 are shown, it is understood that many packages can be formed as part formed together submount 52, with the submount 52 being cut or etched to separated portions of the submount 52 to provide the individual packages.

Each of the LED packages 50 can comprise a portion of the submount 52 for holding an LED chip 54, with some embodiment of the submount 52 having a die pad and conductive traces (not shown) on its top surface. The LED package embodiments shown comprises only a single LED, but it is understood that other embodiments can comprise multiple LEDs arranged in arrays in different ways with different interconnections. Examples of certain LED arrays that can be incorporated in the LED packages according to the present invention are described in U.S. Pat. No. 7,821,023 and U.S. Patent Application Publication No. 2009/0050908, both to Yuan et al., and both entitled "Solid State Lighting Component", and U.S. Patent Application Publication No. 2010/0103660 to van de Ven et al. and entitled "Array Layout for Color Mixing," all three of which are incorporated herein by reference.

The LEDs chip 54 can have many different semiconductor layers arranged in different ways and can emit many different colors in different embodiments according to the present invention. LED structures, features, and their fabrication and operation are generally known in the art and only briefly discussed herein.

The layers of the LED chip 54 can be fabricated using known processes with a suitable process being fabrication using metal organic chemical vapor deposition (MOCVD). The layers of the LED chips generally comprise an active layer/region sandwiched between first and second oppositely doped epitaxial layers all of which are formed successively on a growth substrate. LED chips can be formed on a wafer and then singulated for mounting in a package. It is understood that the growth substrate can remain as part of the final singulated LED or the growth substrate can be fully or partially removed.

It is also understood that additional layers and elements can also be included in the LED chip 54, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP) or aluminum indium gallium phosphide (AlInGaP) or zinc oxide (ZnO).

The growth substrate can be made of many materials such as silicon, glass, sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, North Carolina and methods for producing them are set forth in the scientific literature as well as in a U.S. Pat. Nos. Re. 34,861; 4,946, 547; and 5,200,022.

The LED chip 54 can comprise a conductive current spreading structure and wire bond pads on the top surface, both of which are made of a conductive material and be deposited using known methods. Some materials that can be used for these elements include Au, Cu, Ni, In, Al, Ag or combinations thereof and conducting oxides and transparent conducting oxides. The current spreading structure can comprise conductive fingers arranged in a grid on the LED chip 54 with the fingers spaced to enhance current spreading from the pads into the Led's top surface, In operation, an electrical signal is applied to the pads through a wire bond as described below, and the electrical signal spreads through the of the of the current spreading structure and the top surface into the LED chip 54. Current spreading structures are often used in LEDs where the top surface is p-type, but can also be used for n-type materials.

Some or all of the LED chip 54 can be coated with one or more phosphors with the phosphors absorbing at least some of the LED light and emitting a different wavelength of light such that the LED emits a combination of light from the LED and the phosphor. As described in detail below, in one embodiment according to the present invention at least some of the LED chips can comprise an LED that emits light in the blue wavelength spectrum with its phosphor absorbing some of the blue light and re-emitting yellow light. These LED chips 54 emit a white light combination of blue and yellow light or a non-white light combination of blue and yellow light. As used herein, the term "white light" refers to light that is perceived as white and is within 7 MacAdam ellipses of the black body locus on a 1931 CIE chromaticity diagram and has a CCT ranging from 2000 K to 10,000 K. In one embodiment the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include:
$Tb_{3-x}RE_xO_{12}$:Ce(TAG); RE=Y, Gd, La, Lu; or
$Sr_{2-x-y}Ba_xCa_ySiO_4$:Eu.

In other embodiments, the LED chip can comprise blue emitting LED coated by other phosphors that absorb blue light and emit yellow or green light. Some of the phosphors that can be used for these LED chips include:
YELLOW/GREEN
$(Sr,Ca,Ba)(Al,Ga)_2S_4$:Eu$^{2+}$
$Ba_2(Mg,Zn)Si_2O_7$:Eu$^{2+}$
$Gd_{0.46}Sr_{0.31}Al_{1.23}O_xF_{1.38}$:EU$^{2+}{}_{0.06}$
$(Ba_{1-x-y}Sr_xCa_y)$ $SiO_4$:Eu
$Ba_2SiO_4$:Eu$^{2+}$ The packages can also comprise an LED chip emitting red light, that can comprise LED structures and materials that permit emission of red light directly from the active region. Alternatively, in other embodiments a red emitting LED chip 54 can comprise LEDs covered by a phosphor that absorbs the LED light and emits a red light. Some phosphors appropriate for this structures can comprise:
RED
$Lu_2O_3$:Eu$^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3$:Pr$^{3+}$,Ga$^{3+}$
$CaAlSiN_3$:Eu$^{2+}$
$Sr_2Si_5N_8$:Eu$^{2+}$ Each of the phosphors described above exhibits excitation in the desired emission spectrum, provides a desirable peak emission, has efficient light conversion, and has acceptable Stokes shift. It is understood, however, that many other phosphors can used in combination with other LED colors to achieve the desired color of light.

LED chip 54 can be coated with a phosphor using many different methods, with one suitable method being described in U.S. patent applications Ser. Nos. 11/656,759 and 11/899, 790, both entitled "Wafer Level Phosphor Coating Method and Devices Fabricated Utilizing Method", and both of which are incorporated herein by reference. Alternatively the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED packages according to the present invention can also have multiple LEDs of different colors, one or more of which may be white emitting.

The submount 52 can be formed of many different materials with a preferred material being electrically insulating, such as a dielectric. The submount 52 can comprise ceramic such as alumina, aluminum nitride, silicon carbide, or a polymeric material such as polyimide and polyester etc. In the preferred embodiment, the submount material has a high thermal conductivity such as with aluminum nitride and silicon carbide. In other embodiments the submount 52 can comprise highly reflective material, such as reflective ceramic or metal layers like silver, to enhance light extraction from the component. In other embodiments the submount 52 can comprise a printed circuit board (PCB), sapphire, silicon carbide or silicon or any other suitable material, such as T-Clad thermal clad insulated substrate material, available from The Bergquist Company of Chanhassen, Minn. For PCB embodiments different PCB types can be used such as standard FR-4 PCB, metal core PCB, or any other type of printed circuit board. The size of the submount 52 can vary depending on different factors, with one being the size and number of LED chips 54.

The submount 52 can have die pads and conductive traces that can comprise many different materials such as metals or other conductive materials. In one embodiment they can comprise copper deposited using known techniques such as plating and can then be patterned using standard lithographic processes. In other embodiments the layer can be sputtered using a mask to form the desired pattern. In some embodiments according to the present invention some of the conductive features can include only copper, with others of the features including additional materials. For example, the die pads can be plated or coated with additional metals or materials to the make them more suitable for mounting of LEDs. In one embodiment the die pads can be plated with adhesive or bonding materials, or reflective and barrier layers. The LEDs can be mounted to the die pads using known methods and materials such as using conventional solder materials that may or may not contain a flux material or dispensed polymeric materials that may be thermally and electrically conductive.

In the embodiment shown, wire bonds can be included that pass between the conductive traces and the LED chip 54 with an electrical signal applied to the LED chip 54 through its respective one of the die pads and the wire bonds. In other embodiments LED chip 54 may comprise coplanar electrical contacts on one side of the LED (bottom side) with the majority of the light emitting surface being located on the LED side opposing the electrical contacts (upper side). Such flip-chip LEDs can be mounted. onto the submount 52 by mounting contacts corresponding to one electrode (anode or cathode, respectively) onto the die pad. The contacts of the other LED electrode (cathode or anode, respectively) can be mounted to the traces.

An encapsulant 56 can be included over the LED chip 54 to provide both environmental and mechanical protection. The encapsulant can also act as an optical element or lens over the LED chip 54. In some embodiments the encapsulant 56 can be formed directly over and in direct contact with the LED chip 54 and the top surface of the submount 52 around the LED chips. In other embodiments there may be an intervening material or layer between the encapsulant and LED chip 54 and/or the submount's top surface. Direct contact to the LED chip 54 can provide certain advantages such as improved light extraction and ease of fabricating.

As further described below, the encapsulant 56 can be formed over the LED chip 54 using different encapsulant dispense or molding techniques and the lens can be many different shapes depending on the desired shape of the light output. The LED package 50 can. comprise a meniscus holding feature for encapsulants that are dispensed and is arranged to form a meniscus as result of surface tension between it and the encapsulant. This helps hold the encapsulant in the hemispheric shape as shown until it is cured, with the meniscus holding feature defining the outer boundary of the encapsulant 56 Meniscus holding feature in the context of dispensing encapsulant are discussed in U.S. Patent Application Publication No. 2007/0228387, to Negley et al., entitled "Uniform Emission Pattern LED Package," which is incorporated herein by reference.

One suitable shape for the encapsulant 56 as shown is hemispheric, with some examples of alternative shapes being ellipsoid, bullet, flat, hex-shaped and square. Many different materials can be used for the encapsulant including clear polymers, silicones, plastics or epoxies, with a suitable materials being compatible with the various encapsulant deposition methods described above. Silicone is suitable for dispensing and molding and provides suitable optical transmission properties. It can also withstand some subsequent reflow processes and in many applications exhibits an acceptable rate of degradation over time. It is understood that the encapsulant 56 can also be textured to improve light extraction or can contain materials such as phosphors or scattering particles As discussed above, the encapsulant 56 in the packages according to the present invention can comprise a thixotropic or thickening agent/material 58 that helps allow the encapsulant to hold its shape prior to and during curing. In the embodiments according to the present invention, the thixotropic agent 58 can have an index of refraction that is the same as or close to that of the encapsulant material. In some embodiments, the thixotropic agent 58 can have a refractive index that is within plus or minus $n=0.05$ of the encapsulant. In still other embodiments the thixotropic agent can have a refractive index within plus or minus $n=0.04$ of the encapsulant,while in other embodiments it can have a refractive index within plus or minus $n=0.02$.

It is understood that the thixotropic agent 58 can be made of many different materials or combination of materials. By way of example, some package embodiments can have and encapsulant 56 comprising silicone, which can be optically clear to the light emitted by the package LED, and can have a refractive index of $n\approx1.51$. Fumed silica is often used as a thixotropic agent 58 and has a refractive index of $n\approx1.46$. As discussed above, this difference in refractive index can cause scattering of the LED light, which can result in a cloudy appearance of the encapsulant and a reduction in package emission efficiency.

In embodiments according to the present invention, a thixotropic agent 58 can be used having an index of refraction the same as or closer to that of the encapsulant 56. This can comprise a thixotropic agent 58 made of a single material having or an index of refraction that more closely matches that of the encapsulant 56. In other embodiments, more than one material can be combined to provide a composite thixotropic agent 58 with the desired refractive index. This composite can comprise one or more materials having a refractive index higher than the encapsulant 56 that are combined via suitable chemical reactions with materials having an index of refraction lower than the encapsulant 56. This combination can result in a thixotropic agent 58 having a refractive index that is between the higher and lower refractive index materials and that is the same as or close to the refractive index of the encapsulant 56, i.e. within one of the acceptable ranges discussed above. These different materials can be combined and provided as a thixotropic agent using known methods, such as fuming, spray or laser pyrolysis, with the different materials provided in different concentrations or percentages to provide the composite material with the desired refractive index.

Many different materials can be used to form the thixotropic agents according to the present invention, with one embodiment comprising a composite material or mixture two or more oxides or ceramics. In one embodiment, the thixotropic agent can comprise an aluminosilicate combination of silica ($SiO_2$) which has an index of refraction of n≈1.46 and alumina ($Al_2O_3$) having an index of refraction of n≈1.7. By combining these materials in the appropriate percentage, the resulting composite thixotropic agent can have an index of refraction the same or close to that of the encapsulant, or n≈1.51 for silicone. It is understood that the other composite material can also be used such as titania-silicate composites, or fumed aluminum oxide or titanium oxide composites. For LED packages having higher index of refraction encapsulants, the concentrations of materials in the composites can be varied to allow for the refractive index of thixotropic agent to match the encapsulant. For example, in the thixotropic agent embodiment utilizing silica and alumina, greater concentrations of alumina can be used to increase the refractive index, or reduced amounts can be used to reduce the refractive index.

Although the composite thixotropic agents are described above combining two materials, it is understood that they can comprise composites of many more than two materials. In these embodiments one or more of the materials can have a refractive index lower than the encapsulant's, and one or more can have a refractive index higher that the encapsulant's. The materials can be combined in different concentrations to achieve the desired refractive index.

To allow for the desired rheology or thickness control, the resulting composite thixotropic agent 58 should also comprise particles having a large surface area and/or small particle size. In some embodiments, the particles can comprise a surface area of greater than 100 $m^2$/g, while in other embodiments the surface area can be greater than 300 $m^2$/g. The particle size in some embodiments can be less than 0.1 μm, while in other embodiments can be less than 0.5 μm.

The shape and arrangement of the encapsulant 56 in the LED package 50 is also easily adapted for use with secondary lens or optics that can be included over the lens by the end user to facilitate beam shaping. These secondary lenses are generally known in the art, with many different ones being commercially available. The encapsulant 56 can also have different features to diffuse or scatter light, such as scattering particles or structures. Particles made from different materials can be used such as titanium dioxide, alumina, silicon carbide, gallium nitride, or glass micro spheres, with the particles dispersed within the lens. Alternatively, or in combination with the scattering particles, air bubbles or an immiscible mixture of polymers having a different index of refraction could be provided within the encapsulant or structured on the encapsulant to provide diffusion. The scattering particles or structures can be dispersed homogeneously throughout the encapsulant 56 or can have different concentrations in different areas of the encapsulant 56. In one embodiment, the scattering particles can be in layers within the encapsulant.

The thixotropic agent can be provided in different concentrations in the encapsulant, and in some embodiments the thixotropic material can have a concentration of 20% or less, while in other embodiments it can have a concentration of 10% or less. In embodiments where the thermal or electrical properties of the encapsulant are enhanced by the thixotropic agent, the concentration can be even greater. In the embodiments described above, the thixotropic agent can be provided with the same or similar concentration throughout the encapsulant. In other embodiments, the thixotropic agent can be arranged with different concentrations in different areas of the encapsulant. In other embodiments, different layers with different materials or characteristics can be included on or part of the encapsulant.

Figure 6:
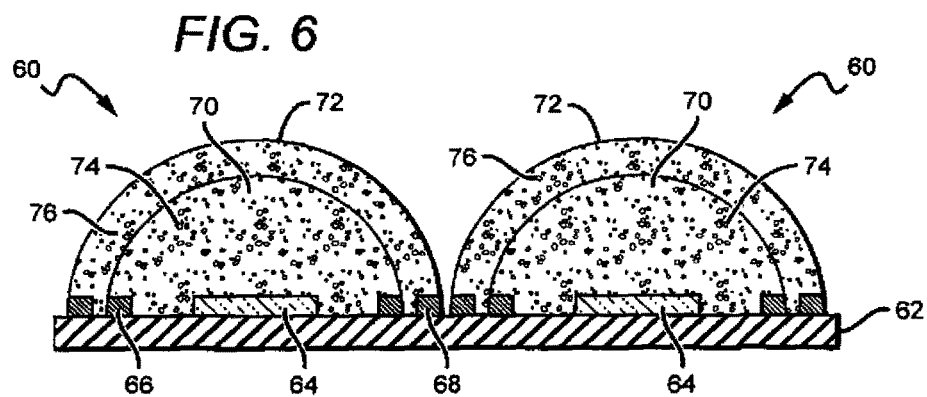
FIG. 6 is a sectional view of another embodiment of an LED package according to the present invention having encapsulant portions.

FIG. 6 shows another embodiment of LED packages 60 that are similar to the LED packages 50 shown in FIGS. 4 and 5, and show two packages 60 prior to singulation. As above, each of the packages comprises an LED chip 64 on the submount 62, and it is understood that many more LED packages can be fabricated on a submount prior to singulation. In this embodiment, first and second meniscus forming features 66, 68 are included for formation of an encapsulant with more than one layer or portion. A first encapsulant portion 70 is dispensed or formed over the LED chip 64 and the surface of the submount 62, with the first meniscus feature 66 defining the outer edge of the first encapsulant portion 70. First thixotropic agents 74 can be included in the first portion 70 to help the first portion 70 hold its hemispheric shape until it is cured. Once it is cured a second hemispheric portion 72 can be dispensed or molded over the first hemispheric portion 70, with the second meniscus feature 68 defining the outer edge of the second encapsulant portion 72. Second thixotropic agents 76 can also be included in the second encapsulant portion 72, and it can then be cured. In some embodiments, first and second thixotropic agents 74, 76 can be the same, and in other embodiments they can be different.

This arrangement provides two layer (or portion) encapsulants that allows for different materials and characteristics in the different layers. For the LED packages 60, the first encapsulant portion 70 can comprise optically clear material with thixotropic agents having the same (or within the ranges described above) refractive index as the encapsulant so that the thixotropic agents to not degrade the clarity of the encapsulant or the LED package's emission efficiency. The second encapsulant portion 72 can comprise scattering properties, either through the use of a second thixotropic agent 76 having a different refractive index than the second portion 72, or by including diffusive or scattering materials to the second portion 72. Many different scattering particles can be used, including but not limited to:

kaolin;
zinc oxide (ZnO);
yttrium oxide ($Y_2O_3$);
titanium dioxide ($TiO_2$);
barium sulfate ($BaSO_4$);
fused silica ($SiO_2$);
aluminum nitride;
glass beads;
zirconium dioxide ($ZrO_2$);
silicon carbide (SiC);
tantalum oxide ($TaO_5$);
silicon nitride ($Si_3N_4$) ;
niobium oxide ($Nb_2O_5$);
boron nitride (BN); or phosphor particles (e.g., YAG:Ce, BOSE)

More than one scattering material in various combinations of materials or combinations of different forms of the same material may be used to achieve a particular scattering effect.

Figure 7:
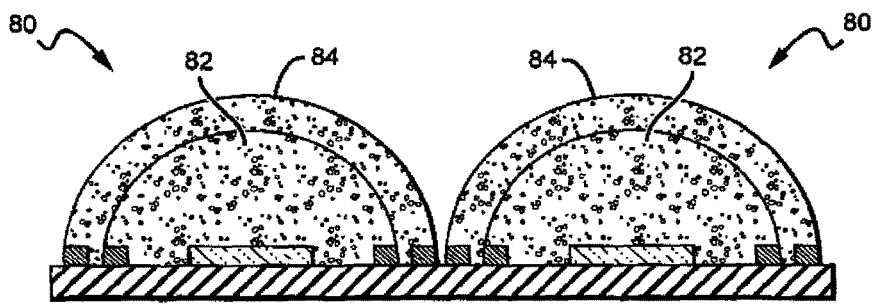
FIG. 7 is a sectional view of another embodiment of an LED package according to the present invention having encapsulant portions.

FIG. 7 shows another embodiment of LED packages 80 according to the present invention that comprises first and second encapsulant portions 82, 84 similar to those in LED packages 60 shown in FIG. 6. In this embodiment, however, the first encapsulant 82 comprises scattering properties, either through thixotropic agents having a refractive index different from the material comprising the first encapsulant, or by including scattering materials. The second encapsulant portion 84 can be optically clear but can also include a thixotropic agent with the same refracting index as the material comprising the second encapsulant portion 84.

FIG. 8 shows still another embodiment of an LED package 90 according to the present invention also having first and second encapsulant portions 92, 94 that are similar to those shown in FIG. 6. In this embodiment, there is only a first meniscus feature 96 that defines the boundary of the first and second encapsulant portions 92, 94. The first encapsulant portion 92 can be dispensed and cured, with the second encapsulant portion 94 dispensed and cured over the first. Like the LED packages 60, the first encapsulant portion 92 can have thixotropic agents such that it is essentially optically clear, while the second portion 94 can have scattering properties. FIG. 9 shows still another embodiment LED package 100 with a first and second encapsulant portions 102, 104 similar to those in FIG. 8, but with the first having scattering properties and the second being optically clear as described above.

It is understood that the LED packages according to the present invention can have two-portion encapsulants arranged in many different ways and can have more than two encapsulant portions. It is also understood that the different layers can be provided with different concentrations of thixotropic agents or scattering material in different areas, and can comprise grading of these agents or materials. It is also understood that curing steps may or may not be used between application of the first and second encapsulants.

In still other embodiments, the different encapsulant portions can take any of the different shapes described above, and can also take other non-hemispheric shapes to control the package emission pattern. FIG. 10 shows one embodiment of a LED package encapsulant 110 according to the present invention that comprises a optically clear first encapsulant portion 112 having an oval shape, with a scattering second encapsulant portion 114 having a circular shape on the first encapsulant portion 112. It is understood that in other embodiments, the first encapsulant portion 112 can have scattering properties, while the second encapsulant portion 114 can be optically clear. FIG. 11 shows a different embodiment of an LED package 120 encapsulant comprising an optically clear first encapsulant portion 122 having a substantially triangular shape at its base, with a scattering second encapsulant portion 124 having a circular shape at its base. Like above, in other embodiments the scattering and clear properties can be reversed in the encapsulant portions. These are only some of the multiple different shapes that can be utilized in the encapsulants according to the present invention, with others comprising ellipsoid, asymmetric-oblong, etc.

In other embodiments the encapsulant or encapsulant portions can comprise many other materials to provide various emission characteristics. In some embodiments, one or more wavelength converter materials can be provided in the encapsulant or different encapsulant portions, such as those materials listed above.

As mentioned above, the present invention can be applied to many different LED package architectures, including those having reflective cups as shown in FIG. 2, and described above. The arrangements described herein are only some of the many applications that can utilize thixotropic agents described herein.

Although the present invention has been described in detail with reference to certain preferred configurations thereof, other versions are possible. Therefore, the spirit and scope of the invention should not be limited to the versions described above.

We claim:

1. A light emitting diode (LED) package, comprising:
an LED chip;
an encapsulant over said LED chip, said encapsulant comprising a first portion over said LED chip and a second portion over said first portion, at least one of said portions comprising an associated encapsulant refractive index;
a meniscus feature, in which an outer edge of the meniscus feature defines an outer boundary of said first and second encapsulant portions; and
a thickening material within at least one of said first and second portions, said material comprising a composite of two or more materials at least one of which comprises an index of refraction lower than said encapsulant refractive index and at least one of which comprises a material with a refractive index higher than said encapsulant refractive index, wherein the concentrations of said two or more materials within said at least one of said first and second portions are such that the combination of the two or more materials results in a refractive index that approaches said associated encapsulant refractive index.

2. The LED package of claim 1, wherein said thickening material comprises a thixotropic material.

3. The LED package of claim 1, wherein said LED chip emits LED light that passes through said encapsulant, said encapsulant and thickening material combination being substantially non-scattering to said LED light.

4. The LED package of claim 1, wherein said thickening material comprises a refractive index that is plus or minus n=0.05 of the encapsulant refractive index.

5. The LED package of claim 1, wherein said thickening material comprises a refractive index that is plus or minus n=0.04 of the encapsulant refractive index.

6. The LED package of claim 1, wherein said thickening material comprises a refractive index that is plus or minus n=0.02 of the encapsulant refractive index.

7. The LED package of claim 1, wherein said thickening material comprises particles with a surface area greater than 100 meters squared per gram ($m^2/g$).

8. The LED package of claim 1, wherein said thickening material comprises particles with a surface area greater than 300 meters squared per gram ($m^2/g$).

9. The LED package of claim 1, wherein said thickening material comprises particles with a size less than 0.1 micrometers (μm).

10. The LED package of claim 1, wherein said thickening material comprises particles with a size less than 0.5 micrometers (μm).

11. The LED package of claim 1, wherein said encapsulant comprises a material with refractive index of n≈1.51, and said thickening material comprising a refractive index of N≈1.51, plus or minus 0.05.

12. The LED package of claim 1, wherein said thickening material comprises one or more oxides.

13. The LED package of claim 1, wherein said encapsulant comprises a polymer and said thickening material comprises one or more oxides.

14. The LED package of claim 1, wherein said encapsulant comprises silicone, and said thickening material comprises an aluminosilicate composite.

15. The LED package of claim 1, wherein said thickening material alters the mechanical properties of said encapsulant without substantially altering its optical properties.

16. The LED package of claim 1, wherein said thickening material alters the thermal properties of said encapsulant without substantially altering its optical properties.

17. The LED package of claim 1, wherein said thickening material alters the electrical properties of said encapsulant without substantially altering its optical properties.

18. The LED package of claim 1, further comprising a submount, said LED mounted to said submount.

19. The LED package of claim 18, wherein said composite thixotropic material has comprises silica and alumina.

20. A light emitting diode (LED) package, comprising:
an LED chip;
an encapsulant over said LED chip, said encapsulant comprising an encapsulant refractive index; and
a thickening material within the encapsulant, the thickening material comprising a composite of two or more oxide materials, said composite material comprising a refractive index that is within plus or minus n=0.05 of the encapsulant refractive index;
wherein said thickening material comprises particles with a surface area greater than 100 meters squared per gram ($m^2/g$).

21. The LED package of claim 20, wherein said thickening material comprises a thixotropic material.

* * * * *